US006466059B1

(12) United States Patent
Gaibotti et al.

(10) Patent No.: US 6,466,059 B1
(45) Date of Patent: Oct. 15, 2002

(54) SENSE AMPLIFIER FOR LOW VOLTAGE MEMORIES

(75) Inventors: Maurizio Gaibotti, Cesano Maderno (IT); Nicolas Demange, Lessy (FR)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/249,834

(22) Filed: Feb. 12, 1999

(30) Foreign Application Priority Data

Feb. 13, 1998 (EP) ............................................... 98830064

(51) Int. Cl.$^7$ ............................................... G01R 19/00
(52) U.S. Cl. ............................................ 327/53; 327/56
(58) Field of Search ............................... 327/51, 52, 53, 327/54, 55, 56, 57, 77, 66, 538, 543; 330/288; 365/210, 185.2, 185.21, 207, 208; 323/315

(56) References Cited

U.S. PATENT DOCUMENTS

| | | | | |
|---|---|---|---|---|
| 4,152,663 A | * | 5/1979 | Van de Sande | 330/288 |
| 5,206,552 A | * | 4/1993 | Iwashita | 327/53 |
| 5,241,505 A | * | 8/1993 | Hashimoto | 365/210 |
| 5,255,233 A | * | 10/1993 | Izumi | 365/185.21 |
| 5,258,959 A | * | 11/1993 | Dallabora et al. | 365/210 |
| 5,321,659 A | * | 6/1994 | Taguchi | 365/207 |
| 5,386,158 A | * | 1/1995 | Wang | 327/51 |
| 5,512,849 A | * | 4/1996 | Wong | 327/77 |
| 5,528,543 A | * | 6/1996 | Stiegler | 365/207 |
| 5,563,826 A | * | 10/1996 | Pascicci et al. | 365/185.21 |
| 5,627,790 A | * | 5/1997 | Golla et al. | 365/210 |
| 5,712,815 A | * | 1/1998 | Bill et al. | 365/185.03 |
| 5,856,748 A | * | 1/1999 | Seo et al. | 327/53 |
| 5,883,837 A | * | 3/1999 | Calligaro et al. | 365/189.01 |
| 5,886,546 A | * | 3/1999 | Hwang | 327/103 |
| 5,889,702 A | * | 3/1999 | Gaultier et al. | 365/185.02 |
| 5,986,940 A | * | 11/1999 | Atsumi et al. | 365/185.03 |

FOREIGN PATENT DOCUMENTS

| | | |
|---|---|---|
| EP | 0 814 484 | 12/1997 |
| FR | 2 623 932 | 6/1989 |

\* cited by examiner

*Primary Examiner*—Matthew Smith
*Assistant Examiner*—Paul Dinh
(74) *Attorney, Agent, or Firm*—Lisa K. Jorgenson; Stephen Bongini; Fleit, Kain, Gibbons, Gutman & Bongini P.L.

(57) ABSTRACT

A sense amplifier of the type coupled to a reference bit line and at least one cell array bit line. The sense amplifier includes an amplifying stage and a current voltage conversion circuit that compare a reference current from the reference bit line and a cell current from the cell array bit line. The current-voltage conversion circuit includes a voltage setting circuit for setting predetermined voltages on the reference bit line and the cell array bit line, a load circuit for the reference bit line and the cell array bit line, and current mirror circuits for mirroring the reference current and the cell current into the amplifying stage. The load circuit for the reference bit line and the current mirror circuit for the reference current are different circuits, and the load circuit for the reference bit line includes a transistor that mirrors a predetermined current that is generated outside of the sense amplifier. Another embodiment provides a sense amplifier that includes a first current mirror having one branch coupled to a cell array bit line, and a second current mirror having a branch coupled to both a reference bit line and another branch of the first current mirror. In one preferred embodiment, the second current mirror mirrors a predetermined current that is generated outside of the sense amplifier. A method for sensing the current of a memory cell in a memory device is also provided.

20 Claims, 2 Drawing Sheets

SENSE AMPLIFIER FOR LOW VOLTAGE MEMORIES

CROSS-REFERENCE TO RELATED APPLICATIONS

This application is based upon and claims priority from prior European Patent Application No. 98-830064.6, filed Feb. 13, 1998, the entire disclosure of which is herein incorporated by reference.

BACKGROUND OF THE INVENTION

1. Field of the Invention

The present invention relates to memory devices, and more specifically to a sense amplifier for low voltage non-volatile memory devices.

2. Description of Related Art

In the following description, conventional terms for MOS (Metal Oxide Semiconductor) transistor technology are used. For example, the term "gate" indicates the control electrode or control gate of a MOS transistor, the term "drain" indicates the load electrode, and the term "source" indicates the source electrode. Further, the term "non-volatile" memory indicates a memory that does not lose stored data when the power supply is shut off, such as a ROM (Read Only Memory), EPROM (Erasable Programmable Read Only Memory), EEPROM (Electrically Erasable Programmable Read Only Memory), and EAROM (Electrically-Alterable Read Only Memory).

In a conventional EEPROM, data is stored substantially by a MOS transistor. The MOS transistor includes two gate electrodes: a control gate that is electrically connected to the circuit and receives the gate voltage, and a floating gate that is separated from the control gate by an $SiO_2$ oxide barrier. Depending on the logic state to be stored, a positive or negative charge is trapped on the floating gate by applying appropriate voltages to the transistor. In particular, the charge is transferred by tunnel effect from the substrate to the floating gate, through the potential barrier of the oxide layer, and trapped on the floating gate.

The trapped charge acts on the voltage-current relationship of the transistor so that a change of the threshold voltage of the transistor takes place in accordance with the type of charge trapped on the floating gate. As a consequence of the threshold change, the memory cell formed by the MOS transistor can assume three different states—written, erased or virgin—depending on if the charge on the floating gate is of one type or the other, or if a charge has ever been applied. The correlation between the logic state, the sign of the trapped charge, and the cell state (written or erased) is a matter of design choice and can change from one product to another according to the selected convention.

The logic state of a cell can be identified by sensing the current flowing though the cell under known bias conditions. In particular, if a negative charge is trapped on the floating gate, the transistor threshold is higher than with a virgin transistor, and therefore with the same gate-source voltage a smaller current will flow. On the other hand, if a positive charge is trapped on the floating gate, the threshold voltage is lower than with a virgin transistor, and thus the current is greater. Thus, the logic state can be detected by using a sense amplifier to compare the current of a cell to the current of a virgin cell under the same biasing conditions.

Conventional sense amplifiers are substantially based on a current mirror that is arranged between two circuit branches: one connected to a virgin cell and another connected to a memory cell. FIG. 1 shows a conventional sense amplifier. As shown, the sense amplifier is a substantially symmetric circuit having a reference branch REF and a second branch pertaining to a cell array MAT. To the reference branch REF, there is connected a reference cell MREF that consists of a floating gate transistor. The reference cell MREF is a virgin cell. To the branch pertaining to the cell array MAT, there is connected a selected cell MMAT. The reference cell MREF and the selected cell MMAT are connected to the sense amplifier 1 through a reference bit line BLREF and an array bit line BLMAT, respectively.

The selected cell MMAT is one of the cells of a memory array, which is not shown in its entirety for simplicity. The cells of the memory array are connected to the bit line of the array BLMAT through their drains, and cells are selected through a suitable decoding circuit (not shown). A reference current IREF flows through the reference cell MREF and is mirrored by the amplifier circuit 1 into the branch of the cell array MAT. In the reference branch REF, the amplifier circuit 1 is represented by a first N-channel MOS transistor N1 whose gate is connected to an inverter INV1, which is controlled by the signal on the bit line BLREF.

A determined voltage VBLREF is fixed on the bit line BLREF, with the determined voltage VBLREF being the voltage on the drain of the reference cell MREF. The determined voltage VBLREF has such a value that between source and drain a voltage VDSREF sufficient to keep the reference cell MREF conducting is present. The voltage VBLREF depends on the threshold voltage of the inverter INV1 and the threshold voltage VTN1 of the first NMOS transistor N1. Between a supply voltage VDD and the drain of the first NMOS transistor N1, there is connected a first P-type MOS transistor P1 as a load. The transistor P1 has its gate and drain connected together in diode configuration so as to mirror the reference current IREF into the branch pertaining to the cell array MAT through a corresponding second P-type transistor P2.

Thus, the first and second PMOS transistors P1 and P2 build a current mirror MR. The voltages VDREF and VDCELL, which are respectively available on the first NMOS transistor N1 drain (node DREF) and on a second NMOS transistor N2 drain (node DMAT), are then brought to an amplifying stage AMP. The remaining portion of the branch of the cell array MAT is similar to the reference branch REF, and will not be further described. The sense amplifier 1 substantially performs a comparison between the reference current IREF and the cell current IMAT and obtains two corresponding voltages VDREF and VDCELL that are sent to the amplifying stage.

For a correct operation of the reference branch REF of the sense amplifier, the supply voltage VDD must fulfill the following equation.

$$VDD > VBLREF + VDSN1 + |VTP1| + OVP1 \quad (1)$$

where VDSN1 is the necessary drain-source voltage of transistor N1, which is saturated in order to supply the reference current IREF; VTP1 is the threshold voltage of the first PMOS transistor P1; and OVP1 is the overdrive voltage necessary to supply the reference current IREF. In this manner, as node DREF is connected to the positive terminal of the amplifying stage AMP, and consequently node DMAT is connected to the negative terminal, the voltage VDREF at node DREF is in the range given by the following equation.

$$VBLREF + VDSN1 < VDREF < VDD - |VTP1| - OVP1 \quad (2)$$

Further, the voltage VDREF is allowed to vary through a sufficient range because it is compared to the voltage VDCELL at node DMAT. If the selected cell MMAT requires a current IMAT greater than the reference current IREF, the voltage VDCELL is less than the voltage VDREF. If these currents are reversed, so are the resulting voltages. From equations (1) and (2), it derives that the supply voltage VDD must be greater than 2 volts to allow both correct operation of the reference branch REF (or the cell array MAT branch) and a sufficient variation voltage VDREF (or VDCELL).

FIG. 2 shows a sense amplifier 2 that is substantially similar to the sense amplifier of FIG. 1, but with two identical sense branches. The final amplifying stage AMP compares the voltages at the nodes DREF and DMAT. However, the sense amplifier of FIG. 2 has the same disadvantage of the sense amplifier of FIG. 1. In particular, the supply voltage must be suitably high to allow correct operation. This disadvantage is particularly serious in modem memory circuits in which it is desired to reduce the supply voltage in order to reduce the power consumption of the circuit.

SUMMARY OF THE INVENTION

In view of these drawbacks, it is an object of the present invention to overcome the above-mentioned drawbacks and to provide an improved sense amplifier for low voltage non-volatile memories.

Another object of the present invention is to provide a sense amplifier for low voltage non-volatile memories that can be used with a supply voltage lower than is typically used for memory devices.

Still another object of the present invention is to provide a sense amplifier for low voltage non-volatile memories that allows the supply voltage to be reduced at least by the value of the threshold voltage of a load transistor.

A further object of the present invention is to provide a sense amplifier for low voltage non-volatile memories in which the input voltage of the final amplifying stage relating to the reference cell is independent from the voltage of the corresponding bit line.

Yet another object of the present invention is to provide a sense amplifier for non-volatile memories that allows the supply voltage to be reduced without reducing the speed of the memory device.

One embodiment of the present invention provides a sense amplifier of the type coupled to a reference bit line and at least one cell array bit line. The sense amplifier includes an amplifying stage and a current-voltage conversion circuit that compare a reference current from the reference bit line and a cell current from the cell array bit line. The current-voltage conversion circuit includes a voltage setting circuit for setting predetermined voltages on the reference bit line and the cell array bit line, a load circuit for the reference bit line and the cell array bit line, and current mirror circuits for mirroring the reference current and the cell current into the amplifying stage. The load circuit for the reference bit line and the current mirror circuit for the reference current are different circuits, and the load circuit for the reference bit line includes a transistor that mirrors a predetermined current that is generated outside of the sense amplifier.

Another embodiment of the present invention provides a sense amplifier that includes a first current mirror having one branch coupled to a cell array bit line, and a second current mirror having a branch coupled to both a reference bit line and another branch of the first current mirror. In a preferred embodiment, the branch of the second current mirror mirrors a predetermined current that is generated outside of the sense amplifier. A method for sensing the current of a memory cell in a memory device is also provided.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Preferred embodiments of the present invention will be described in detail hereinbelow with reference to the attached drawings.

Figure 3:
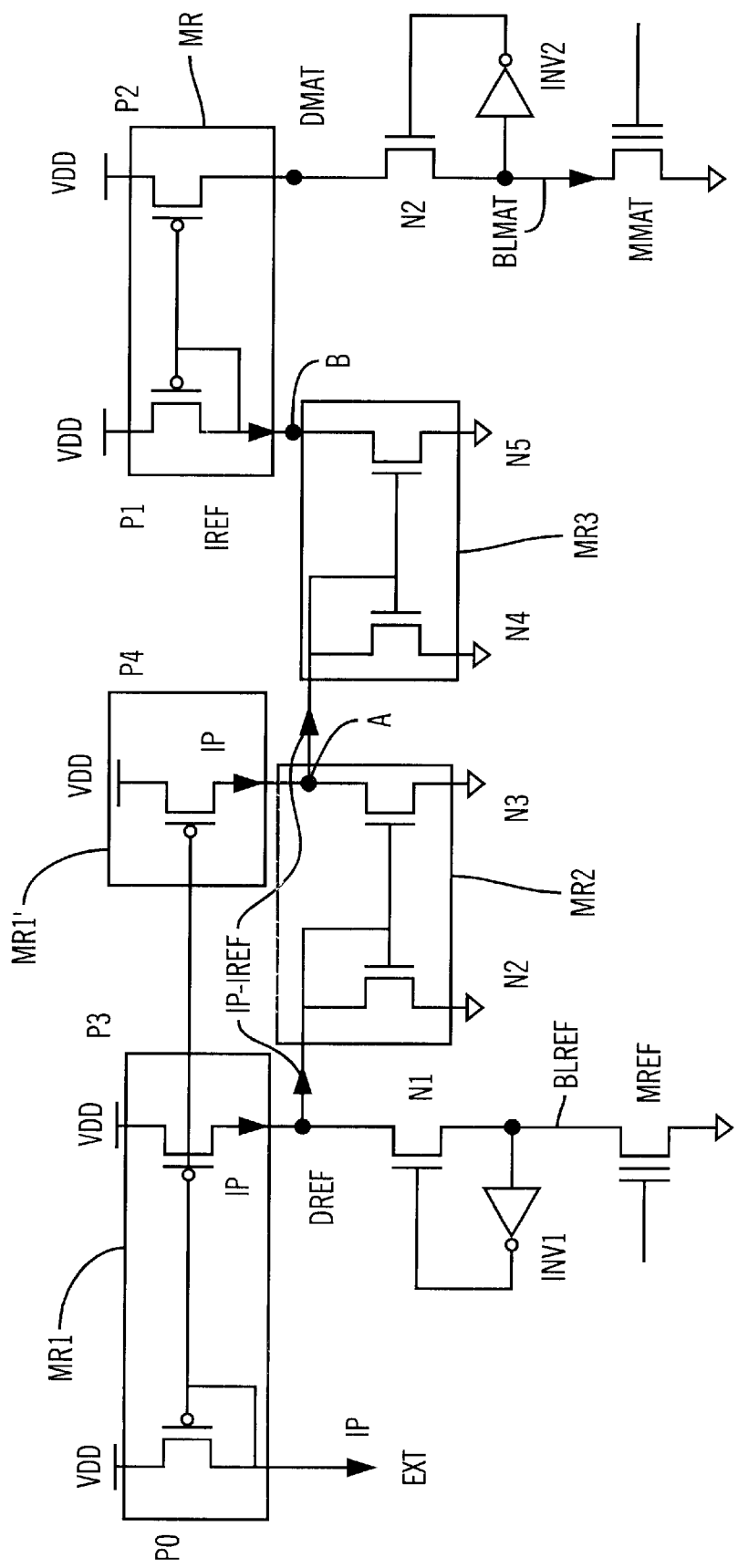
FIG. 3 shows a schematic diagram of a sense amplifier for non-volatile memories according to a preferred embodiment of the present invention.

FIG. 3 shows a sense amplifier according to a preferred embodiment of the present invention. (In FIG. 3, the amplifying stage is not shown for simplicity.) As shown, the sense amplifier includes five current mirrors MR1, MR1', MR2, MR3, and MR. The first current mirror MR1 is formed by a P-channel MOS transistor P0 whose drain is connected to a node EXT, which is connected to an external generator (not shown). The external generator draws a driving current IP from the node EXT.

The transistor P0 is connected as a diode and mirrors the driving current IP into two PMOS transistors P3 and P4 that cooperate to implement the first and second current mirrors MR1 and MR1'. The drain of transistor P3 is connected to the reference node DREF, and a transistor N1 is also connected to reference node DREF in a similar manner as described above with respect to FIGS. 1 and 2. The transistor N1 and an associated inverter INV1 fix a determined voltage VBLREF on the reference bit line BLREF. To the reference node DREF there is also connected the third current mirror MR2, which is formed by two NMOS transistors N2 and N3.

The drain of transistor P4 is connected to a node A to which there are connected the drain of NMOS transistor N3 (which gives the output of the current mirror MR2) and the drain of NMOS transistor N4 (which together with NMOS transistor N5 forms the fourth current mirror MR3). The fifth current mirror MR, which is formed by PMOS transistors P1 and P2, is connected to a node B that is common to the drains of transistors N5 and P1, and to the array bit line BLMAT through a node DMAT. An N-channel MOS transistor N6 and an inverter INV2 are connected to the node DMAT in a similar manner to that described above with respect to FIGS. 1 and 2. The fifth current mirror MR is the same as the current mirror of FIG. 1.

The operation of the sense amplifier of FIG. 3 will now be explained. NMOS transistor N2 draws a current IP-IREF and mirrors it into transistor N3. The drain of transistor N3 is connected to transistor P4, which mirrors the driving current IP so that from node A towards transistor N4, the reference current IREF is again injected. The reference current IREF is mirrored through the fifth current mirror MR to mirror the current IREF into the branch of the cell array MAT in order to allow the correct operation of the amplifying stage AMP, which has an input connected to node DMAT. Thus, the reference current IREF can be compared to the current IMAT in the fifth current mirror MR in a similar manner as in the circuit of FIG. 1.

As for the voltages, with VGIP being the voltage on the gate of transistor P3, voltage VCREF at the node DREF must be low enough to keep the transistors P3 and P4 saturated, so as to guarantee an effective operation of the first current mirror MR1. This gives the following equation.

$$VDREF<VGIP+|VTP3| \quad (3)$$

Additionally, the minimum source-drain voltage of transistor P3 (VSDP3MIN) can be expressed as a function of supply voltage VDD and VDREF.

$$VSDP3MIN=VDD-(VGIP+|VTP3|) \quad (4)$$

If the P-channel of transistor P3 is designed broad enough, the sum VGIP+|VTP3| is almost equal to the value of supply voltage VDD, so that the minimum source-drain voltage of transistor P3 (VSDP3MIN) is very small. As a result, the supply voltage VDD of the sense amplifier for allowing correct operation of the reference branch REF is given by the following equation.

$$VDD>VBLREF+VDSN1+VSDP3MIN \quad (5)$$

Figure 1:
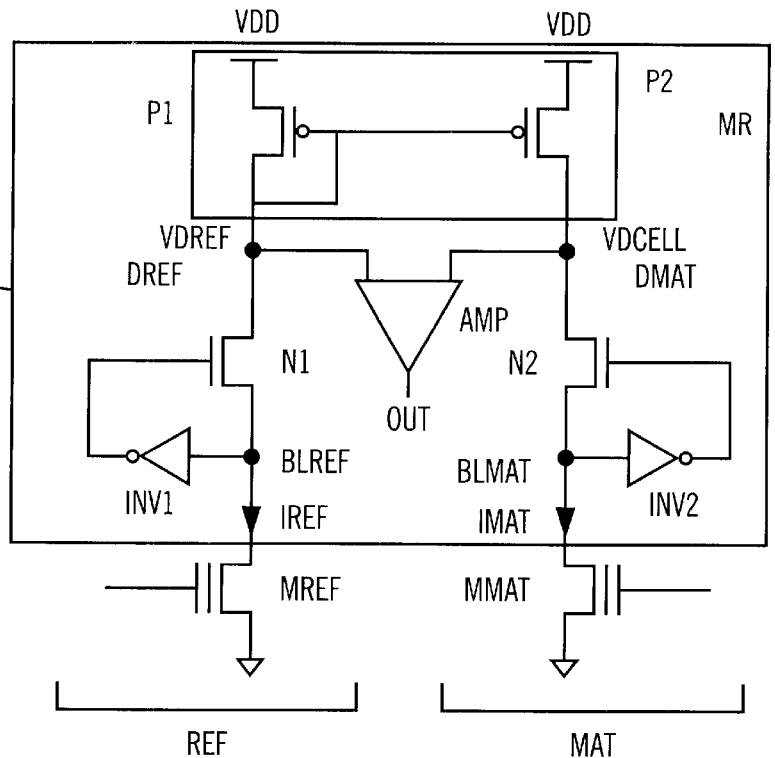
FIG. 1 shows a schematic diagram of a first conventional sense amplifier for non-volatile memories.
Figure 2:
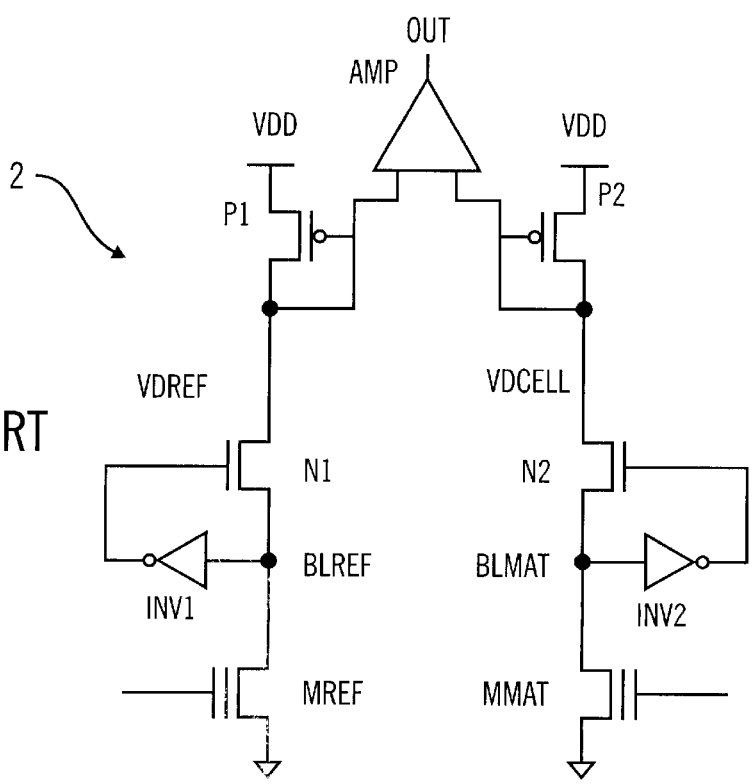
FIG. 2 shows a schematic diagram of a second conventional sense amplifier for non-volatile memories.

Comparing equation (5) with equation (1) for the sense amplifier of FIG. 1, the threshold voltage VTP3 of transistor P3 is no longer present, and the overdrive voltage OVP3 and the minimum source-drain voltage of transistor P3 have approximately equal values. Therefore, the minimum supply voltage VDD is reduced by an amount equal to the threshold voltage of a P-channel transistor. Considering the voltage at node B (i.e., VB), the voltage VB for correct operation of current mirrors MR3 and MR must only comply with the following equation.

$$VB>VA-VTN5 \quad (6)$$

where VA is the voltage at node A and VTN5 is the threshold voltage of transistor N5. As a result, for current mirrors MR3 and MR, there are no constraints related to the voltages VBLREF and VBLMAT on the bit lines.

As compared with the sense amplifier of FIG. 1, there are two substantial differences in the sense amplifier of FIG. 3. First, transistor P3 connected to node DREF is no longer in diode configuration and therefore no longer operate as an active load. This allows the threshold voltage VTP3 to be eliminated. Second, between node DREF and the fifth current mirror MR, two current mirrors MR2 and MR3 are inserted for the purpose of making the voltage at node B independent of the voltage VBLREF of the bit line BLREF.

For correct operation, the P-channel transistors must have channels of sufficient width so that the voltage VSDMIN is low. For the same purpose, it is also preferred to provide broad channels in transistors N1 and N6, so that according to relation (5) it is possible to use a still lower supply voltage VDD. On the other hand, transistors N2, N3, N4, and N5 must have conveniently narrow channels so as to not limit voltages VA and VDREF to the threshold values. Further, for correct operation of the sense amplifier, the driving current IP must be selected conveniently greater than the maximum reference current IREF.

Accordingly, the sense amplifier of the present invention allows a reduced supply voltage without prejudicing reference cell operation. The supply voltage reduction corresponds to at least the value of the threshold voltage of a P-channel transistor. Further, the supply voltage reduction is obtained through a circuit arrangement that does not prejudice the speed of the circuit. The sense amplifier of the present invention also allows the input voltage of the final amplifying stage pertaining to the reference cell to be rendered independent of the voltage that controls the operation of the original current mirror (i.e., that connected to the bit line of the cell to be measured).

Although the sense amplifier of the present invention has been described above with respect to a preferred embodiment, the invention is not meant to be so limited. For example, in further embodiments, the current mirror ratios are different than one in order to perform operations on the current drawn from the reference cells. In one such embodiment, the mean current of two reference cells connected to the bit line is used as reference current. For this purpose, there is used a transistor P3 that gives a current mirror ratio of one and a transistor P4 that gives a current mirror ratio of ½. By providing a mirror ratio of ½ in current mirror MR2, there is obtained in current mirror MR3 the mean value of the two reference currents of the reference cells. Thus, in general, by changing the mirror ratios, in current mirror MR there can be a current that is a function of the reference bit line BLREF current.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, other embodiments of the present invention may not include all of the features described above. Therefore, it is intended that the present invention not be limited to the particular embodiments disclosed, but that the invention include all embodiments falling within the scope of the appended claims.

What is claimed is:

1. A sense amplifier for comparing a reference current drawn from a reference bit line and a cell current drawn from a cell array bit line, said sense amplifier comprising:

an amplifying stage having an input coupled to a reference node of the reference bit line and another input coupled to an array node of the cell array bit line;

a mirroring circuit coupled between the reference node and the array node, the mirroring circuit mirroring the reference current from the reference bit line to the cell array bit line;

a voltage setting circuit coupled to the reference bit line, the voltage setting circuit setting a predetermined voltage on the reference bit line; and current compensation circuits for a predetermined current that is generated outside of the sense amplifier, the current compensation circuits being provided between the voltage setting circuit for the reference bit line and the mirroring circuit, wherein a first transistor is coupled between the reference node and a power supply so as to operate as a load circuit for the reference bit line, the mirroring circuit includes a second transistor coupled between the array node and the power supply so as to operate as a load circuit for the cell array bit line, and the load circuit for the reference bit line mirrors the predetermined current that is generated outside of the sense amplifier.

2. The sense amplifier as defined in claim 1, wherein the current compensation circuits are current mirror circuits.

3. The sense amplifier as defined in claim 2, wherein the load circuit for the reference bit line is a branch of a current mirror, the other branch of which receives the predetermined current.

4. A sense amplifier coupled to a reference bit line and at least one cell array bit line of a memory, said sense amplifier comprising:

a first current mirror having a first branch coupled to the cell array bit line of the memory;

a second current mirror having a first branch coupled to a second branch of the first current mirror; and a third current mirror having a branch coupled to the reference bit line of the memory and to a second branch of the second current mirror, wherein the branch of the third current mirror mirrors a predetermined current that is generated outside of the sense amplifier, and the branch of the third current mirror includes a transistor that is coupled to the reference bit line, the transistor not having its gate and drain connected together so as not to be in a diode configuration.

5. A sense amplifier coupled to a reference bit line and at least one cell array bit line of a memory, said sense amplifier comprising:

a first current mirror having a first branch coupled to the cell array bit line of the memory;

a second current mirror having a first branch coupled to a second branch of the first current mirror;

a third current mirror having a branch coupled to the reference bit line of the memory; and a fourth current mirror having a first branch coupled to the branch of the third current mirror, and a second branch coupled to the second branch of the second current mirror, wherein the second branch of the first current mirror includes a transistor that has its gate and drain connected together so as to be in a diode configuration.

6. The sense amplifier as defined in claim 5, further comprising a fifth current mirror having a branch coupled to the second branch of the fourth current mirror.

7. The sense amplifier as defined in claim 6, wherein the second branch of the first current mirror is directly connected to the first branch of the second current mirror, and the first branch of the fourth current mirror is directly connected to the branch of the third current mirror and the second branch of the fourth current mirror is directly connected to the second branch of the second current mirror.

8. A sense amplifier coupled to a reference bit line and at least one cell array bit line of a memory, said sense amplifier comprising:

a first current mirror having a first branch coupled to the cell array bit line of the memory;

a second current mirror having a branch coupled to both the reference bit line of the memory and a second branch of the first current mirror; and at least one third current mirror coupled between the second branch of the first current mirror and the branch of the second current mirror, wherein the first branch of the first current mirror includes a transistor that is coupled to the cell array bit line, the transistor not having its gate and drain connected together so as not to be in a diode configuration.

9. The sense amplifier as defined in claim 8, wherein the branch of the second current mirror mirrors a predetermined current that is generated outside of the sense amplifier.

10. The sense amplifier as defined in claim 8, wherein the at least one third current mirror includes at least two current mirrors.

11. A method for sensing the current of a memory cell in a memory device by comparing a current from a first line connected to at least one reference cell with a current from a second line connected to at least one memory cell, said method comprising the steps of:

using bias and load circuits to produce a voltage that is dependent on the current on nodes of the lines;

mirroring a predetermined external current to a reference current, the predetermined external current being a third current that is different than the current from the first line and different than the current from the second line;

mirroring, through a first mirroring circuit, the reference current so as to separate the bias and load circuits from a second mirroring circuit; and comparing the voltage on the nodes.

12. The method as defined in claim 11, further comprising the step of:

supplying, through a current compensation circuit, the reference current to the second mirroring circuit.

13. A method for sensing the current of a memory cell in a memory device by comparing a current from a first line connected to at least one reference cell with a current from a second line connected to at least one memory cell, said method comprising the steps of:

using bias and load circuits to produce a voltage that is dependent on the current on nodes of the lines;

mirroring, through a first mirroring circuit, a reference current so as to separate the bias and load circuits from a second mirroring circuit;

comparing the voltage on the nodes;

mirroring a predetermined external current to the reference current;

supplying, through a current compensation circuit, the reference current to the second mirroring circuit;

drawing the reference current generated by two reference cells; and dividing by two, through the current compensation circuit, a current obtained by adding the predetermined external current to the reference current, and adding thereto one half of the predetermined external current so as to obtain a mean value of current supplied by the reference cells.

14. A sense amplifier for comparing a reference current drawn from a reference bit line and a cell current drawn from a cell array bit line, said sense amplifier comprising:

an amplifying stage having an input coupled to a reference node of the reference bit line and another input coupled to an array node of the cell array bit line; and a mirroring circuit coupled between the reference node and the array node, the mirroring circuit mirroring the reference current from the reference bit line to the cell array bit line, wherein the mirroring circuit includes:
: a first transistor coupled between the reference node and a power supply so as to operate as a load circuit for the reference bit line; and
: a second transistor coupled between the array node and the power supply so as to operate as a load circuit for the cell array bit line, and
: the load circuit for the reference bit line mirrors a predetermined current that is generated outside of the sense amplifier, the predetermined current being a third current that is different than the reference current and different than the cell current.

15. The sense amplifier as defined in claim 14, wherein the mirroring circuit includes at least one current mirror having one branch coupled to the predetermined current and another branch coupled to the reference bit line.

16. The sense amplifier as defined in claim 14, wherein the mirroring circuit includes at least one current mirror circuit that has a mirroring ratio that is not equal to one.

17. An information handling system including at least one memory device that contains at least one sense amplifier for comparing a reference current drawn from a reference bit line and a cell current drawn from a cell array bit line, said sense amplifier comprising:
: an amplifying stage having an input coupled to a reference node of the reference bit line and another input coupled to an array node of the cell array bit line; and
: a mirroring circuit coupled between the reference node and the array node, the mirroring circuit mirroring the reference current from the reference bit line to the cell array bit line,
: wherein the mirroring circuit includes:
:: a first transistor coupled between the reference node and a power supply so as to operate as a load circuit for the reference bit line; and
:: a second transistor coupled between the array node and the power supply so as to operate as a load circuit for the cell array bit line, and
:: the load circuit for the reference bit line mirrors a predetermined current that is generated outside of the sense amplifier, the predetermined current being a third current that is different than the reference current and different than the cell current.

18. The information handling system as defined in claim 17, wherein the mirroring circuit includes at least one current mirror having one branch coupled to the predetermined current and another branch coupled to the reference bit line.

19. The information handling system as defined in claim 18, further comprising:
: a voltage setting circuit coupled to the reference bit line, the voltage setting circuit setting a predetermined voltage on the reference bit line; and
: current compensation circuits for the predetermined current, the current compensation circuits being provided between the voltage setting circuit for the reference bit line and the mirroring circuit.

20. The sense amplifier as defined in claim 18, wherein the load circuit for the reference bit line is a branch of a current mirror, the other branch of which receives the predetermined current.

* * * * *